United States Patent [19]

Lawlyes

[11] Patent Number: 5,324,890
[45] Date of Patent: Jun. 28, 1994

[54] DIRECT BOND COPPER-OUTPUT FOOTPRINT

[75] Inventor: Daniel A. Lawlyes, Cicero, Ind.

[73] Assignee: Delco Electronics Corporation, Kokomo, Ind.

[21] Appl. No.: 118,545

[22] Filed: Sep. 9, 1993

[51] Int. Cl.$^5$ .................................... H01L 23/02
[52] U.S. Cl. .................... 174/52.4; 29/830; 437/209; 361/808
[58] Field of Search ............ 174/52.1, 52.3, 52.4; 29/884, 874, 829, 830, 831, 832, 842, 860; 361/414, 415, 412, 417, 418; 437/180, 209; 228/56.3

[56] References Cited

U.S. PATENT DOCUMENTS

| | | | |
|---|---|---|---|
| 3,864,014 | 2/1975 | Lynch | 439/389 |
| 4,288,841 | 9/1981 | Gogal | 361/414 |
| 4,396,547 | 8/1983 | Bauermans | 156/634 |
| 4,605,153 | 8/1986 | Van Den Brekel et al. | 228/56.3 |
| 4,717,347 | 1/1988 | Babow et al. | 439/72 |
| 5,005,069 | 4/1991 | Wasmer et al. | 357/72 |
| 5,063,665 | 11/1991 | Lamey et al. | 29/611 |
| 5,163,856 | 11/1992 | McGaffigan et al. | 439/874 |
| 5,242,097 | 9/1993 | Socha | 228/56.3 |

*Primary Examiner*—Leo P. Picard
*Assistant Examiner*—Christopher Horgan
*Attorney, Agent, or Firm*—Cary W. Brooks; Mark A. Navarre

[57] ABSTRACT

The invention includes a flat, planar, single piece copper footprint including a first portion for mounting an aluminum bond pad, and a third portion for mounting a semi-conductor device, and a second portion, interposed between the first and third portions, which is recessed and includes arcuate-shaped sides. The recessed arcuate-shaped sides of the second portion of the copper footprint act as a solder stop preventing solder from flowing from the first portion to the third portion or vice versa.

4 Claims, 1 Drawing Sheet

DIRECT BOND COPPER-OUTPUT FOOTPRINT

FIELD OF THE INVENTION

This invention relates to semi-conductor devices, and more particularly to semi-conductor devices utilizing a flat direct bond copper-output footprint.

BACKGROUND OF THE INVENTION

Semi-conductor devices utilizing copper footprints have been known as shown in FIG. 1. FIG. 1 illustrates a semi-conductor device 10 including a non-planar stepped copper footprint 12 having first 14, second 16 and third 18 step portions. The first 14 and third 18 step portions have substantially the same thickness and are relatively larger in area than the second step 16 portion interposed therebetween. The second step 16 of the copper footprint is thinner and smaller in area than either the first or third step of the copper footprint. A semi-conductor element 20, such as a DMOS (diffused metal-oxide semi conductor) device, is soldered to the first step 14 of the copper footprint and an aluminum bond pad 22 is soldered to the top surface of the third step 18 of the copper footprint. Nothing is bonded to the thinner narrower second step 16 portion. The downward step created by the thinner second step 16 of the copper footprint prevents the solder 24, 26 from flowing from the first step 14 or the third step 18 of the copper footprint and making an electrical connection between the semi-conductor element 20 and the aluminum bond pad 22. In this way the second step 16 creates a solder stop.

However, this non-planar, three step copper footprint of the prior art is difficult to make and is expensive. Thus, heretofore, there has been a need for a simple, inexpensive method of providing a solder stop on a semi-conductor device utilizing a copper footprint.

SUMMARY OF THE INVENTION

The invention includes a flat, planar, single-piece copper footprint including a first portion for mounting a semi conductor device, a third portion for mounting an aluminum bond pad, and a second portion interposed between the first and third portions which is recessed and includes arcuate-shaped sides. The recessed arcuate-shaped sides of the second portion of the copper footprint act as a solder stop preventing solder from flowing from the first portion to the third portion of the footprint or vice versa.

These and other features, objects and advantages will become apparent from the following brief description of the drawings, detailed description and appended claims and drawings.

DETAILED DESCRIPTION

Figure 1:
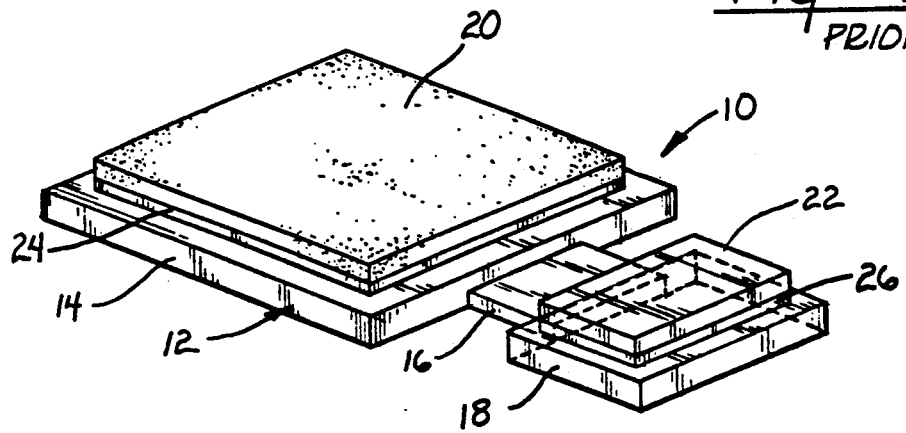
FIG. 1 is an illustration of a non-planar, three-step copper footprint of the prior art.
Figure 2:
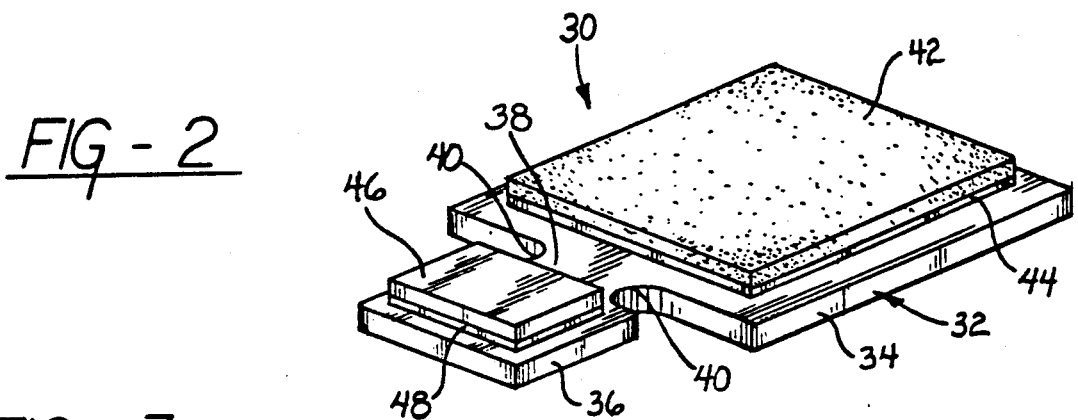
FIG. 2 illustrates a flat, planar, single-piece copper footprint according to the present invention.

FIG. 2 illustrates a semi-conductor device 30 including a flat, planar single-piece copper footprint 32 according to the present invention. The flat copper footprint includes first 34, second 38 and third 36 portions. The first portion 34 and the third portion 36 are each substantially rectangular in shape. Interposed between the first and third portions is a second portion 38 which is narrower in width than the first or third portions. The second portion has arcuate-shaped sides 40. Despite the copper footprint being flat and a single-piece, the arcuate-shaped sides 40 of the second portion 38 act as a solder stop preventing solder from flowing from the first portion 34 to the third portion 36 of the copper footprint and vice versa. Preferably the arcuate-shaped sides are shaped like semi-circles. These semi-circles may have a radius of about 0.38 mm. A semi-conductor element 42 is connected to the first portion 34 of the footprint by a solder layer 44. An aluminum bond pad 46 is connected to the third portion 36 of the footprint by a solder layer 48.

Figure 3:
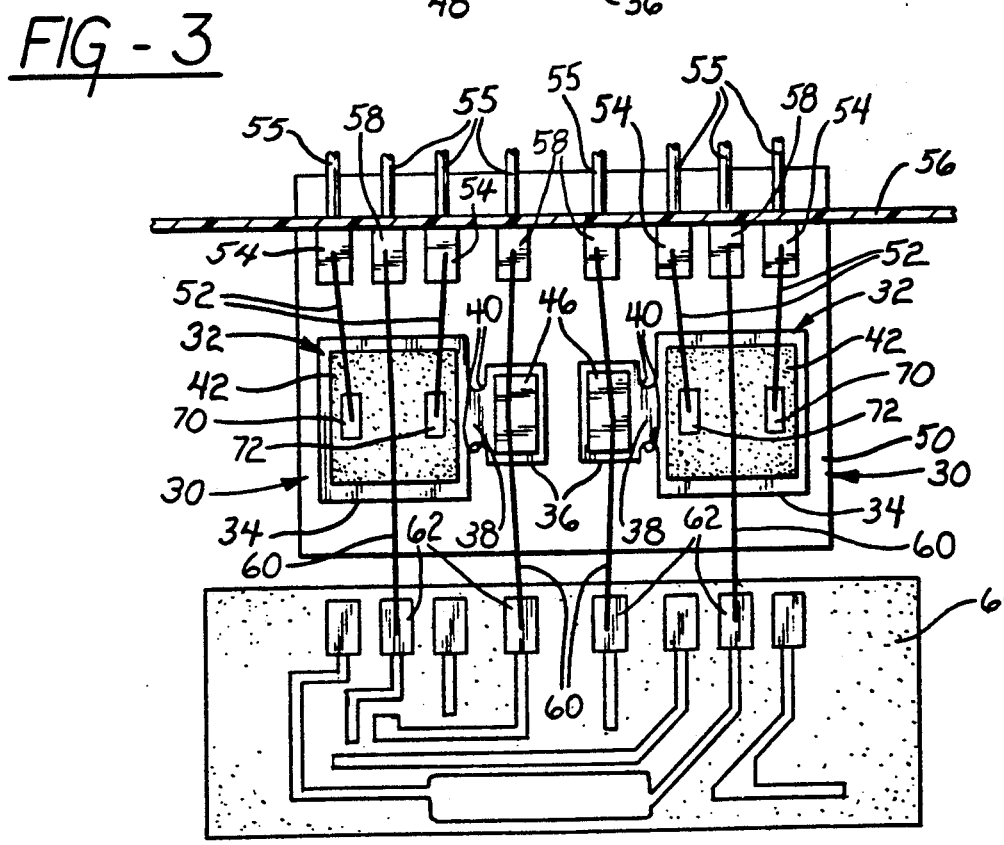
FIG. 3 is an illustration of a semiconductor device including a flat, planar single-piece copper footprint having an aluminum bond pad and DMOS device mounted thereon with wire bonds connected to a hybrid circuit and an external power source.

FIG. 3 illustrates a semi-conductor device including a flat, planar, single-piece copper footprint according to the present invention. The semi-conductor device includes a first sheet of copper (not shown) which is ultrasonically bonded to one side of the ceramic substrate 50 such as BeO. The flat, planar, single-piece copper footprint is directly bonded to the other side of the ceramic substrate at elevated temperatures. A contact pad 46, such as an aluminum bond pad is soldered to the third portion 36 of the copper footprint. Nothing is bonded to the second portion of the copper footprint. A semi-conductor device 42, such as a DMOS device, is soldered to the first portion 34 of the flat, planar, single-piece copper footprint to form a semi-conductor device subassembly.

The semi-conductor subassembly including the flat, planar, single-piece copper footprint may be utilized as a switch in a semi-conductor device module. Aluminum wires 52 may be ultrasonically bonded to contact pads 70, 72 formed on the top surface of the DMOS device, for example, to serve as a source and gate, respectively. The other end of the wire bond may be ultrasonically bonded to paddles 54 of electrical pins 55 held in a plastic module header 56 for connection to an external power source. In this case, the aluminum bond 46 pad serves as a drain for the semi-conductor device. An aluminum wire 60 may be provided from an electrical pin paddle 58 (for connection to an external source) to a contact pad 62 on a hybrid circuit formed on an appropriate substrate 64 such as a ceramic substrate.

The embodiments of the invention in which an exclusive property or privilege is claimed as defined as follows:

1. A device comprising:
   a flat, planar, single-piece electrically conductive footprint including a first substantially rectangular-shaped portion and a third substantially rectangular-shaped portion, and a second portion interposed between the first and third portions of the copper footprint; a metal oxide semi-conductor device soldered to the first portion of the footprint, and an electrically conductive bond pad soldered to the third portion of the footprint; said second portion having a width less than the first and third portions of the footprint and having arcuate-shaped sides constructed and arranged to act as a solder stop preventing solder from flowing from between the first and third portions of the footprint during assembly; and electrical connections provided to the metal-oxide semi-conductor device and the bond pad.

2. A device as set forth in claim 1 wherein said footprint comprises copper.

3. A method of making a semi-conductor assembly comprising:

providing a planar electrically conductive footprint including first, second and third portions, said second portion being interposed between said first and third portions, and said second portion having a width less than said first and third portions;

soldering a metal-oxide semi-conductor device to the first portion of the footprint and soldering a contact pad to the second portion of the footprint; and said second portion having arcuate-shaped sides constructed and arranged to act as a solder stop preventing solder from flowing between said first and third portions of the footprint during assembly.

4. A method as set forth in claim 3 wherein said footprint comprises copper.